(12) United States Patent  
Mazzochette

(10) Patent No.: US 7,528,421 B2
(45) Date of Patent: May 5, 2009

(54) SURFACE MOUNTABLE LIGHT EMITTING DIODE ASSEMBLIES PACKAGED FOR HIGH TEMPERATURE OPERATION

(75) Inventor: Joseph Mazzochette, Cherry Hill, NJ (US)

(73) Assignee: Lamina Lighting, Inc., Westampton, NJ (US)

( * ) Notice: Subject to any disclaimer, the term of this patent is extended or adjusted under 35 U.S.C. 154(b) by 0 days.

(21) Appl. No.: 11/179,863

(22) Filed: Jul. 12, 2005

(65) Prior Publication Data

US 2006/0006405 A1 Jan. 12, 2006

Related U.S. Application Data

(63) Continuation-in-part of application No. 10/638,579, filed on Aug. 11, 2003, now Pat. No. 7,095,053.

(60) Provisional application No. 60/467,857, filed on May 5, 2003.

(51) Int. Cl.
H01L 33/00 (2006.01)

(52) U.S. Cl. .................. 257/99; 257/98; 257/100; 257/E33.057; 257/E33.058; 257/E33.075

(58) Field of Classification Search ............... 257/81, 257/88, 98, 99, 100, 676, 707, 708, E33.057, 257/E33.058, E33.059, E33.075, 82
See application file for complete search history.

(56) References Cited

U.S. PATENT DOCUMENTS

| | | | |
|---|---|---|---|
| 3,711,789 A | 1/1973 | Dierschke | |
| 4,729,076 A * | 3/1988 | Masami et al. | 362/235 |
| 4,902,567 A | 2/1990 | Eilertsen et al. | |
| 5,117,281 A | 5/1992 | Katsuraoka | 357/81 |
| 5,122,781 A | 6/1992 | Saubolle | 340/473 |
| 5,140,220 A | 8/1992 | Hasegawa | 313/512 |
| 5,235,347 A | 8/1993 | Lee et al. | |
| 5,441,774 A | 8/1995 | Dutta et al. | |
| 5,482,898 A | 1/1996 | Marrs | 437/216 |
| 5,485,037 A | 1/1996 | Marrs | 257/712 |
| 5,581,876 A | 12/1996 | Prabhu et al. | 29/851 |
| 5,674,554 A | 10/1997 | Liu et al. | |
| 5,725,808 A | 3/1998 | Tormey et al. | 252/514 |
| 5,745,624 A | 4/1998 | Chan et al. | 385/91 |
| 5,841,244 A | 11/1998 | Hamilton et al. | |
| 5,847,507 A | 12/1998 | Butterworth et al. | |
| 5,847,935 A * | 12/1998 | Thaler et al. | 361/761 |
| 5,857,767 A | 1/1999 | Hochstein | 362/294 |
| 5,908,155 A | 6/1999 | Duffy et al. | |

(Continued)

FOREIGN PATENT DOCUMENTS

DE 19625622 1/1998

(Continued)

Primary Examiner—Ngan Ngo
Assistant Examiner—Benjamin Tzu-Hung Liu
(74) Attorney, Agent, or Firm—Cantor Colburn LLP

(57) ABSTRACT

Light emitting diode (LED) assemblies packaged for high temperature operation and surface mounting. In particular, the LED assemblies according to the present invention are constructed to include a thermally conducting base and an optically efficient cavity that provides protection for the LED assembly and maximizes light extraction. The LED assemblies are particularly adapted for easy and efficient surface mounting or bolt down assembly mounting in high temperature environments.

24 Claims, 6 Drawing Sheets

U.S. PATENT DOCUMENTS

| | | | |
|---|---|---|---|
| 5,953,203 | A | 9/1999 | Tormey et al. ............... 361/313 |
| 5,959,316 | A | 9/1999 | Lowery |
| 5,977,567 | A | 11/1999 | Verdiell ....................... 257/99 |
| 5,998,925 | A | 12/1999 | Shimizu et al. |
| 6,016,038 | A | 1/2000 | Mueller et al. |
| 6,045,240 | A | 4/2000 | Hochstein .................... 362/294 |
| 6,066,861 | A | 5/2000 | Hohn et al. |
| 6,069,440 | A | 5/2000 | Shimizu et al. |
| 6,137,224 | A | 10/2000 | Centofante |
| 6,224,216 | B1 | 5/2001 | Parker et al. |
| 6,245,259 | B1 | 6/2001 | Hohn et al. |
| 6,259,846 | B1* | 7/2001 | Roach et al. ................. 385/123 |
| 6,277,301 | B1 | 8/2001 | Hohn et al. |
| 6,325,524 | B1 | 12/2001 | Weber et al. ................. 362/245 |
| 6,376,268 | B1 | 4/2002 | Verdiell ....................... 438/26 |
| 6,417,019 | B1 | 7/2002 | Mueller et al. |
| 6,428,189 | B1 | 8/2002 | Hochstein .................... 362/373 |
| 6,455,930 | B1 | 9/2002 | Palanisamy et al. .......... 257/706 |
| 6,478,402 | B1 | 11/2002 | Greive et al. |
| 6,480,389 | B1 | 11/2002 | Shie et al. .................... 361/707 |
| 6,483,623 | B1 | 11/2002 | Maruyama ................... 359/180 |
| 6,498,355 | B1 | 12/2002 | Harrah et al. |
| 6,518,502 | B2 | 2/2003 | Hammond et al. .......... 174/52.4 |
| 6,565,239 | B2* | 5/2003 | Rizkin et al. ................. 362/373 |
| 6,576,488 | B2 | 6/2003 | Collins, III et al. |
| 6,576,930 | B2 | 6/2003 | Reeh et al. |
| 6,577,073 | B2 | 6/2003 | Shimizu et al. |
| 6,592,780 | B2 | 7/2003 | Hohn et al. |
| 6,608,332 | B2 | 8/2003 | Shimizu et al. |
| 6,613,247 | B1 | 9/2003 | Hohn et al. |
| 6,614,179 | B1 | 9/2003 | Shimizu et al. |
| 6,622,948 | B1 | 9/2003 | Haas et al. |
| 6,627,115 | B2 | 9/2003 | Hampden-Smith et al. |
| 6,630,691 | B1 | 10/2003 | Mueller-Mach et al. |
| 6,634,750 | B2 | 10/2003 | Neal et al. .................... 351/211 |
| 6,634,770 | B2 | 10/2003 | Cao .............................. 362/294 |
| 6,682,207 | B2 | 1/2004 | Weber et al. |
| 6,692,252 | B2 | 2/2004 | Scott ............................ 433/29 |
| 6,727,643 | B2 | 4/2004 | Suehiro et al. |
| 6,734,465 | B1 | 5/2004 | Taskar et al. |
| 6,747,293 | B2 | 6/2004 | Nitta et al. |
| 6,791,119 | B2 | 9/2004 | Slater, Jr. et al. |
| 6,793,374 | B2 | 9/2004 | Begemann et al. |
| 6,799,864 | B2 | 10/2004 | Bohler et al. ................. 362/236 |
| 6,812,500 | B2 | 11/2004 | Reeh et al. |
| 6,827,469 | B2 | 12/2004 | Coushaine et al. |
| 6,828,170 | B2 | 12/2004 | Roberts et al. ................ 438/27 |
| 6,831,302 | B2 | 12/2004 | Erchak et al. |
| 6,833,669 | B2 | 12/2004 | George et al. |
| 6,866,394 | B1 | 3/2005 | Hutchins et al. |
| 6,885,035 | B2 | 4/2005 | Bhat et al. |
| 6,943,380 | B2 | 9/2005 | Ota et al. |
| 6,964,877 | B2 | 11/2005 | Chen et al. |
| 6,982,829 | B1 | 1/2006 | Berman |
| 7,033,060 | B2 | 4/2006 | Dubuc et al. |
| 7,095,053 | B2 | 8/2006 | Mazzochette et al. |
| 7,098,483 | B2 | 8/2006 | Mazzochette et al. |
| 7,235,189 | B2 | 6/2007 | Hohn et al. |
| 7,276,736 | B2 | 10/2007 | Hohn et al. |
| 2001/0030326 | A1 | 10/2001 | Reeh et al. |
| 2001/0030866 | A1* | 10/2001 | Hochstein .................... 362/294 |
| 2002/0163006 | A1* | 11/2002 | Yoganandan et al. .......... 257/81 |
| 2002/0175621 | A1 | 11/2002 | Song et al. ................... 313/315 |
| 2003/0010993 | A1 | 1/2003 | Nakamura et al. |
| 2003/0025485 | A1 | 2/2003 | McTigue |
| 2003/0057421 | A1 | 3/2003 | Chen ............................ 257/79 |
| 2003/0077385 | A1 | 4/2003 | Ainsworth et al. |
| 2003/0156608 | A1 | 8/2003 | Ido et al. |
| 2003/0189830 | A1* | 10/2003 | Sugimoto et al. ........... 362/294 |
| 2003/0189930 | A1* | 10/2003 | Sugimoto et al. ........... 362/294 |
| 2003/0193055 | A1 | 10/2003 | Martter et al. |
| 2004/0026706 | A1 | 2/2004 | Bogner et al. ................. 257/99 |
| 2004/0223315 | A1 | 11/2004 | Suehiro et al. |
| 2005/0088625 | A1 | 4/2005 | Imade |
| 2005/0168147 | A1 | 8/2005 | Innocenti et al. |
| 2005/0189557 | A1 | 9/2005 | Mazzochette et al. |
| 2005/0225222 | A1 | 10/2005 | Mazzochette et al. |
| 2005/0270666 | A1 | 12/2005 | Loh et al. |
| 2006/0006405 | A1 | 1/2006 | Mazzochette |
| 2006/0105484 | A1 | 5/2006 | Basin et al. |

FOREIGN PATENT DOCUMENTS

| | | |
|---|---|---|
| DE | 19638667 | 4/1998 |
| EP | 0862794 | 9/1998 |
| EP | 0936682 | 8/1999 |
| EP | 1017112 | 7/2000 |
| EP | 1221724 | 7/2002 |
| JP | 10-012926 | 1/1998 |
| JP | 2000-294701 | 10/2000 |
| WO | WO-97/50132 | 12/1997 |
| WO | WO-98/05078 | 2/1998 |
| WO | WO-98/12757 | 3/1998 |

* cited by examiner

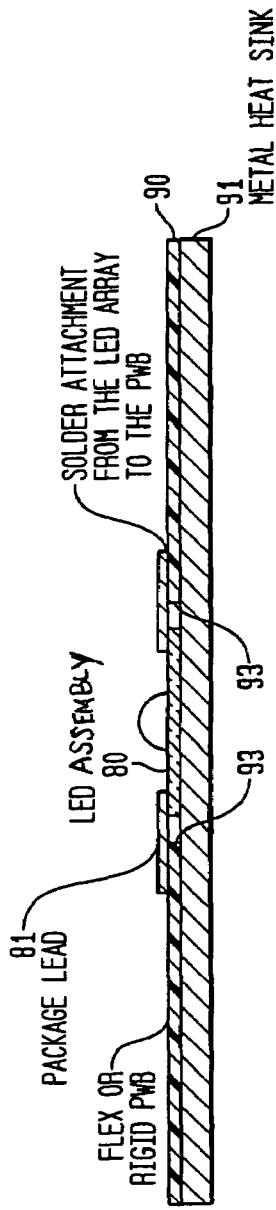
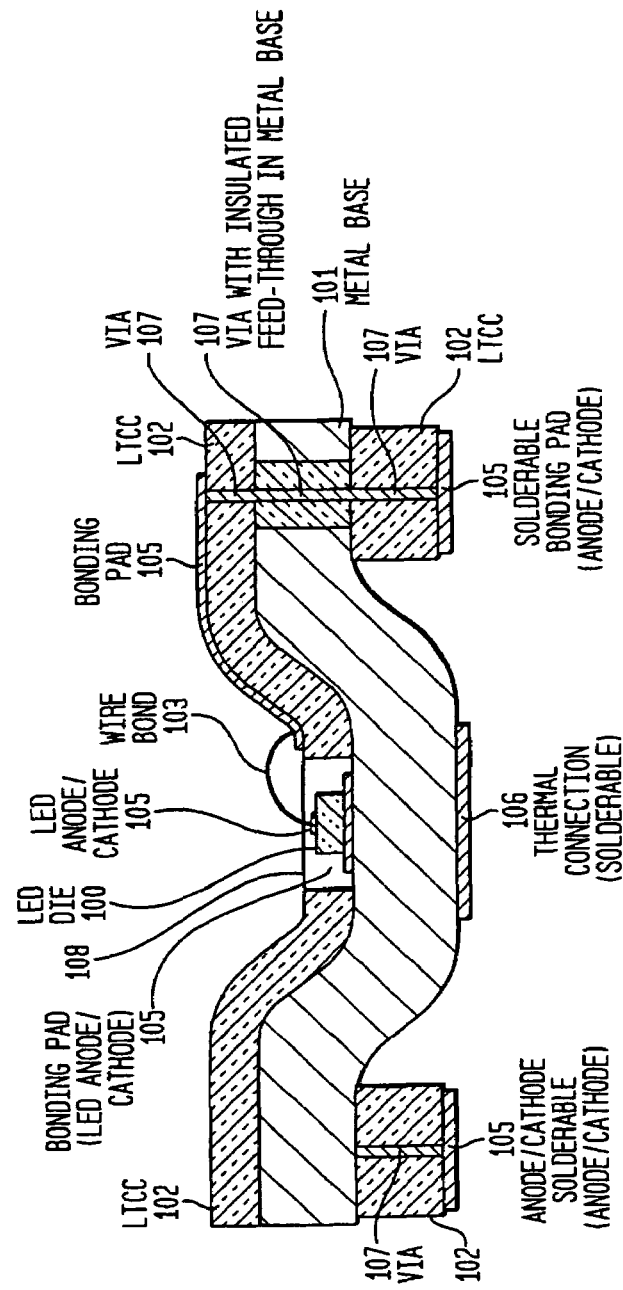

SURFACE MOUNTABLE LIGHT EMITTING DIODE ASSEMBLIES PACKAGED FOR HIGH TEMPERATURE OPERATION

CROSS REFERENCE TO RELATED APPLICATION

This application is continuation-in-part of U.S. patent application Ser. No. 10/638,579, filed on Aug. 11, 2003 now U.S. Pat. No. 7,095,053. U.S. patent application Ser. No. 10/638,579 in turn claims the benifit of U.S. Provisional Application Ser. No. 60/467,857, filed on May 5, 2003. U.S. patent application Ser. No. 10/638,579 and U.S. Provisional Application Ser. No. 60/467,857 are incorporated by reference herein.

FIELD OF THE INVENTION

This invention relates to packaged assemblies of light emitting diodes (LEDs) and,in particular, to LED assemblies packaged for surface mounting and high temperature operation. The present invention further relates to number of arrangements for mounting the LED assemblies.

BACKGROUND OF THE INVENTION

Packaged light emitting diodes (packaged LEDs) are being used as light sources in an increasing variety of applications extending from communications and instrumentation to household and automotive lighting and image display. Packaged LEDs are now being considered for nearly all functions being performed by incandescent light bulbs.

One factor limiting the full potential of packaged LEDs is the thermal limits of conventional packaging. The commercially prevalent packaging assembly disposes semiconductor LED die in a plastic package. In these assemblies, both the die and the plastic package are temperature sensitive. The temperature sensitivity (reduced light generation) of the die has been ameliorated by refining the purity of the semiconductor materials. Improved LED die will now operate at about 120° C. But plastic LED packages typically have an operational limit of about 80° C. Meanwhile, the industry now seeks packaged LED assemblies that can operate at 200° C. Thus, the potential applications of LEDs are now limited by the thermal limits of packaging.

Another limiting factor is the relatively high cost of fabricating and mounting packaged LED assemblies. There exist highly promising fabrication techniques such as surface mount technology (SMT) and bolt down assembly (BDA), but these approaches typically require solder reflow temperatures that are too high for use with conventional plastic packaging and mounting. Thus, lower cost production of LED packages is also constrained by the thermal limits of conventional packaging. Accordingly, there is a need for an improved light emitting diode assembly packaged for surface mounting and higher temperature operation.

SUMMARY OF THE INVENTION

In accordance with the invention, a light emitting diode assembly packaged for surface mounting and high temperature operation comprises a thermally conducting base and one or more electrically insulating layers overlying the base and defining a surface cavity. According to an embodiment of the present invention, one or more electrical connection paths are disposed on the one or more electrically insulating layers. Each electrical connection path may include terminals and connection pads. An assembly of LED die is disposed at least partially within the surface cavity. The assembly of LED die is thermally coupled to the thermally conducting base and electrically connected to the connection pads of the electrical connection paths. Advantageously, the thermally conducting base may include a high thermally-conductive metal and the insulating layers may be composed of ceramic. The packaged assemblies are mountable, particularly on circuit boards, using efficient surface mount technology or bolt down assembly techniques.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 9 schematically illustrates the packaged assembly of FIG. 8 mounted on a printed wiring board; and FIG. 10 illustrates an LTCC-M packaged LED assembly including various optional features, according to an embodiment of the present invention.

DETAILED DESCRIPTION

This description is divided into two parts. Part I describes the structure and features of LED assemblies packaged for high temperature fabrication and/or operation. Part II provides further details of the low-temperature co-fired ceramic-metal ("LTCC-M") technology advantageously used in packaging the arrays.

I. Surface Mountable LED Assemblies Packaged for High Temperature Operation

Figure 1A:
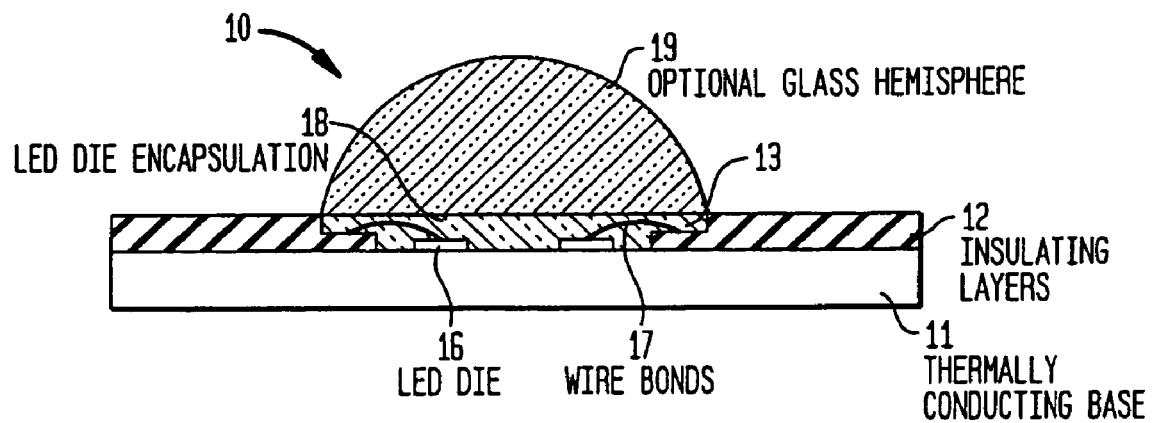
FIGS. 1(a) and 1(b) illustrate a cross sectional view and a top view, respectively, of a packaged LED assembly for high temperature operation, in accordance with an embodiment of the present invention.
Figure 1B:
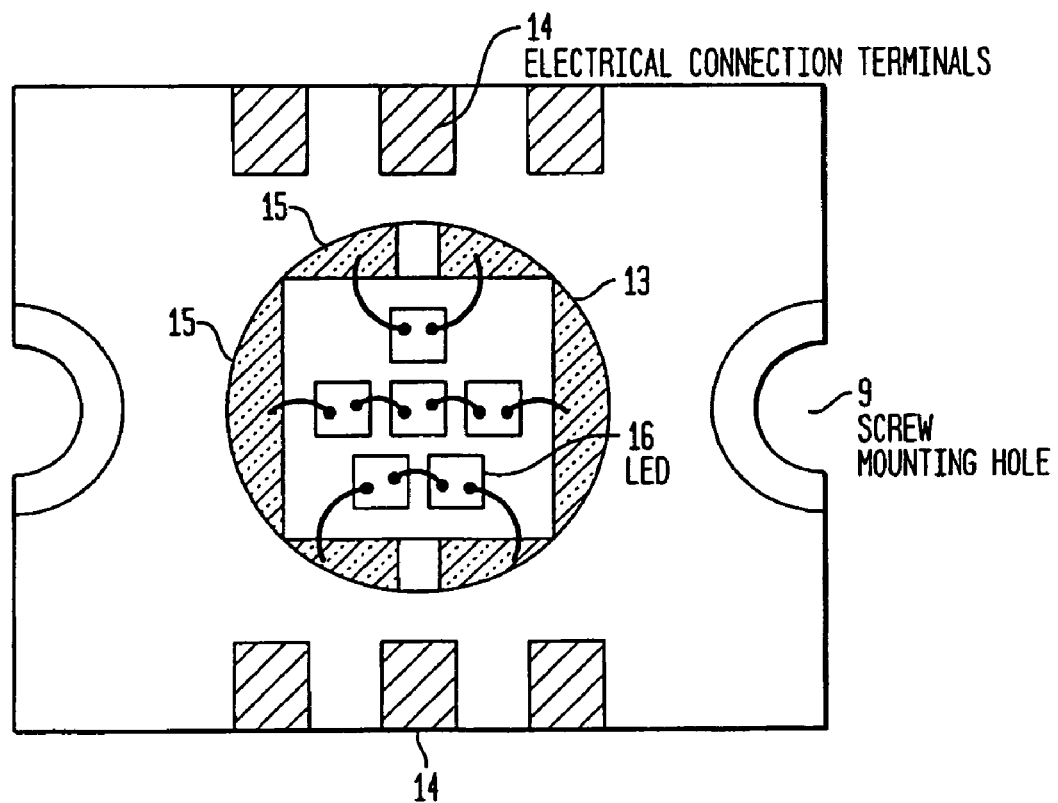

Referring to the drawings, FIGS. 1(a) and 1(b) illustrate a cross section view and a top view, respectively, of an LED assembly 10 packaged for high temperature. The packaged LED assembly 10 includes a thermally conducting base 11 and one or more electrically insulating layers 12 overlying the base 11 and defining a surface cavity 13. One or more electrical connection paths are disposed on the insulating layers 12. According to an embodiment of the present invention, each electrical connection path includes a terminal 14, a connection pad 15, and connector paths (not shown) which connects each terminal 14 to its respective pad 15. One or more LED die 16 are disposed within the surface cavity 13 such that each LED die 16 is in thermal contact with the base 11. One having ordinary skill in the art will appreciate that thermal contact between the base 11 and the LED die 16 may be established by either mounting the LED die 16 directly on the base 11 or by mounting the LED die 16 on a relatively thin intervening layer of thermally conducting material. Furthermore, it is to be appreciated that the assembly may be arranged in order to achieve any desired degree of thermal contact between the LED die 16 and the base 11, including a close thermal coupling between the components. The LED die 16 are electrically connected to the respective connection pads 15, according to any known connecting means, such as, for example, by bonding wires 17. One having ordinary skill in the art will appreciate that the bonding wires 17 may be composed of any suitable material, such as gold or aluminum.

According to an embodiment of the present invention, the LED die 16 may be attached to the base 11 using an epoxy, a conductive epoxy, a solder, an eutectic die attach, or other suitable adhesive. The LED die 16 are sealed in the surface cavity 13 and protected by filling the cavity 13 with an optically clear encapsulant 18, such as, for example, a clear epoxy, silicone, polyurethane, or other clear material.

Optionally, an optical element 19, such as a glass dome, may be attached overlying the LED die 16 using the adhesive properties of the encapsulant 18 or a separate adhesive material. The optical element 19 may be hemispherical, or any shape. One having ordinary skill in the art will appreciate that the shape of the optical element 19 may be selected according to the desired shape and beam width of the light output, and, accordingly, may be selected to improve light extraction and protect the LED assembly 10. For convenience of mounting, the base 11 may include one or more screw or bolt mounting holes 9, as shown in FIG. 1B.

Optionally, each surface cavity 13 may include one or more LED die 16 disposed thereon. Each of the plurality of LED die 16 may be similar to one another, or may vary in size, light output, wavelength (color), electrical parameters, bandwidth, or etc. The plurality of LED die 16 may be electrically connected such that they operate together, separately, or in any desired combination.

One having ordinary skill in the art will appreciate that one or more additional devices (not shown) may be added to the LED assembly 10. Such additional devices may include, for example, ESD protection circuits, driver circuits, light output detectors, temperature detectors, and/or compensation circuits. These additional devices may be used to control and maintain of any number of LED performance parameters, such as, light output, wavelength, color, and/or temperature.

Figure 2:
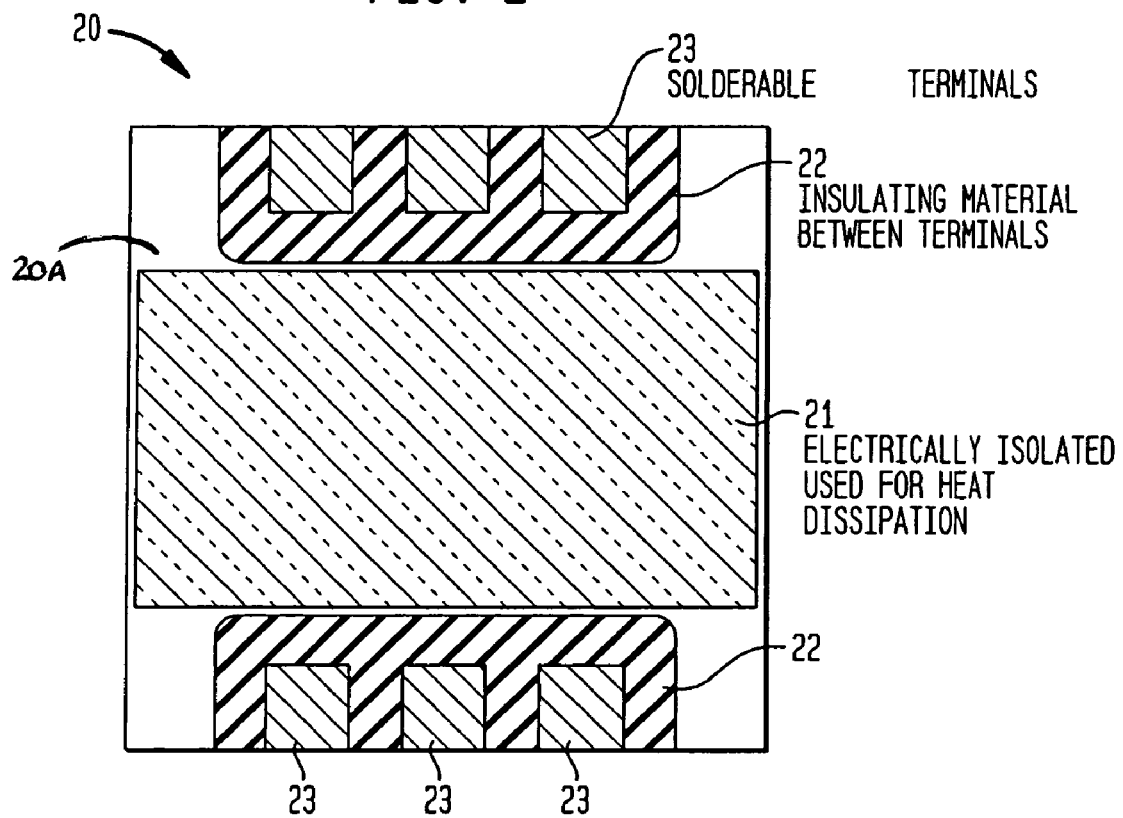
FIG. 2 is a bottom view of a packaged LED assembly for high temperature operation adapted for surface mount assembly, according to an embodiment of the present invention.

FIG. 2 illustrates a bottom view of a LED assembly 20 adapted for surface mounting. The LED assembly 20 includes a bottom surface 20A which includes a central region 21 composed of a thermally conductive material. The central region 21 may be an integral part of the base 11 or thermally coupled to the base 11. According to an embodiment of the present invention, the central region 21 is composed of the same material as the base 11. One having ordinary skill in the art will appreciate that the thermally conductive central region 21 advantageously provides for heat dissipation.

According to an embodiment of the present invention, one or more insulators 22 may be used to electrically isolate the central region 21 from the connection path between the one or more solderable terminals 23 and the LED die 16. The insulators 22 also provide isolation between respective solderable terminals 23. Also disposed on the bottom surface 20A of the LED assembly 20 are one or more solderable terminals 23 which provide electrical connection to the LED die 16. One having ordinary skill in the art will appreciate that the one or more solderable terminals 23 may be composed of any suitable material, including, for example, a silver palladium (AgPd) terminal.

According to an embodiment of the present invention, the surface mountable LED assembly package 20 may include electrically isolated terminals on the bottom surface 20A of the package 20 that are connected to the LED die 16 in the LED assembly 20. Optionally, the packaged LED assembly 20 may be readily connected to a printed wire board having appropriate pads for terminals 23 and a heat spreader for region 21.

Figure 3:
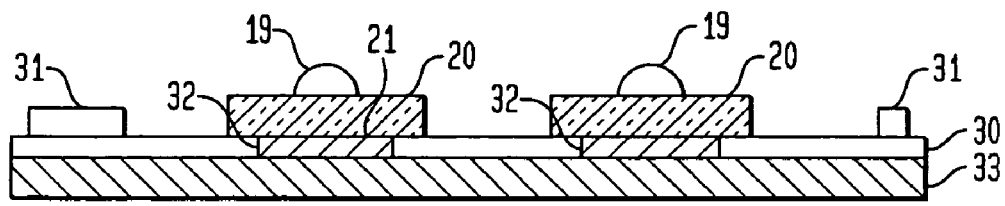
FIG. 3 schematically illustrates the packaged LED assembly of FIG. 2 surface mounted on a printed wiring board, according to an embodiment of the present invention.

FIG. 3 schematically illustrates a plurality of LED assemblies 20 surface mounted on a printed wiring board (PWB) 30 including additional surface mounted components 31. One having ordinary skill in the art will appreciate that the additional surface mounted components 31 may include, for example, integrated circuits, resistors, capacitors, etc. In addition, the PWB 30 may include one or more heat spreaders 32 in thermal contact with central regions 21 of the LED assemblies 20, and/or a metal heat sink 33. Accordingly, heat from the LED die 16 is transmitted by a high thermal conductivity path from the LED die 16 through the base 11 and heat spreader 32 to the heat sink 33.

Figure 4:
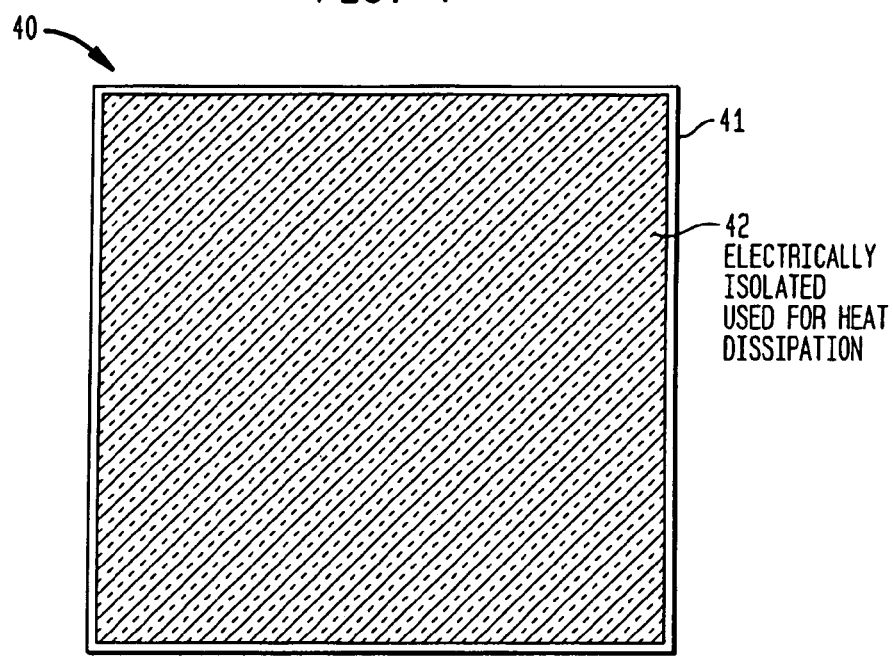
FIG. 4 is a bottom view of a packaged LED assembly adapted for inverted attachment to a printed wiring board, according to an embodiment of the present invention.

FIG. 4 illustrates a bottom view of a packaged LED assembly 40 adapted for inverted attachment to a printed wiring board, according to an embodiment of the present invention. The bottom surface of the LED assembly 40, shown in FIG. 4, includes a thermally conductive central region 42 adapted to be placed in thermal contact with a thermally conducting base (not shown in FIG. 4), or that is part of the base. Preferably, the thermally conductive central region 42 is composed of the same material as the base. Advantageously, the thermally conductive central region 42 is electrically isolated by a peripheral region 41 which is composed of any suitable electrically insulating material. The bottom surface of the LED assembly 40 allows for the dissipation of heat from the LED die 16.

Figure 5:
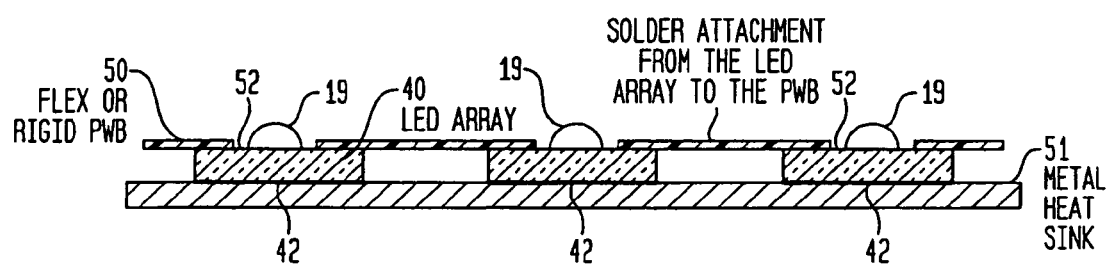
FIG. 5 schematically shows a plurality of packaged LED assemblies mounted on a printed wiring board by inverted attachment, according to an embodiment of the present invention.

FIG. 5 schematically illustrates a plurality of packaged LED assemblies 40 mounted on an apertured printed wiring board 50 by inverted attachment. As illustrated in FIG. 5, each assembly 40 is mounted on a metal heat sink 51. The thermally conductive region 42 of each LED assembly 40 is thermally coupled to the heat sink 51 via thermally conductive material. The encapsulated diode region under optical element 19 of each LED assembly 40 is mounted in registration with a respective aperture 52 in the apertured printed wiring board 50.

Optionally, the LED assemblies 40 may be solder attached via terminals 14 (shown in FIG. 1(b)) to corresponding pads (not shown) on the underside of the apertured printed wiring board 50. The bottom surface of the LED assemblies 40 may be attached to the heat sink 51 using an suitable adhesive, such as, for example, an epoxy.

Figure 6A:
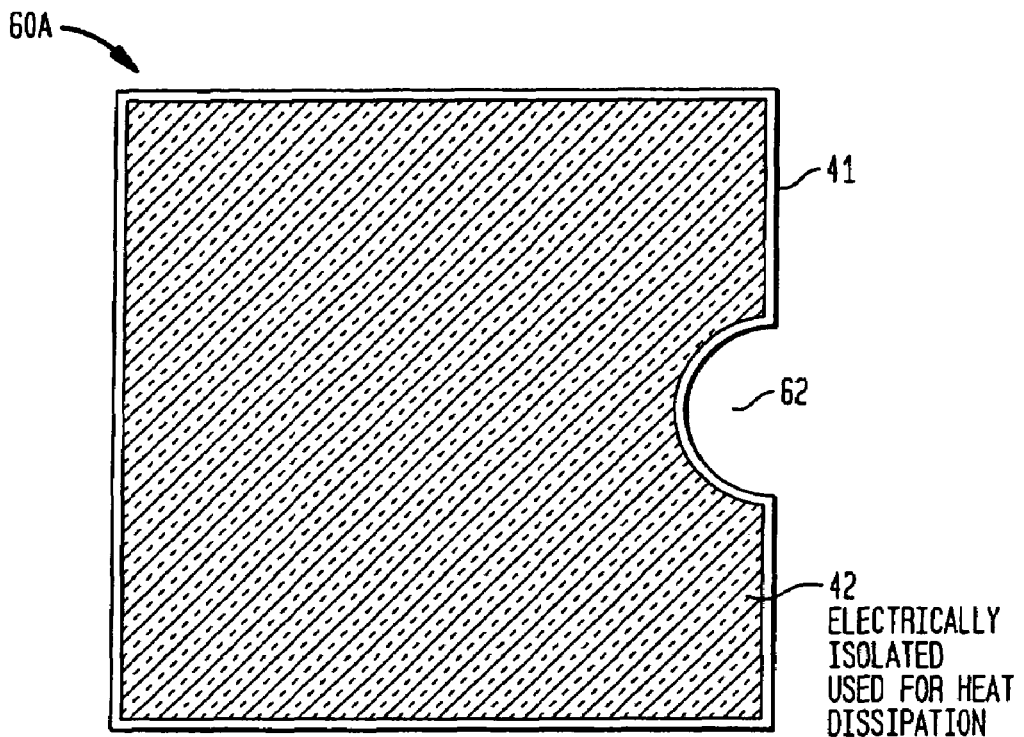
FIGS. 6(a) and 6(b) are bottom views of a packaged LED assembly adapted for bolt down assembly, according to an embodiment of the present invention.
Figure 6B:
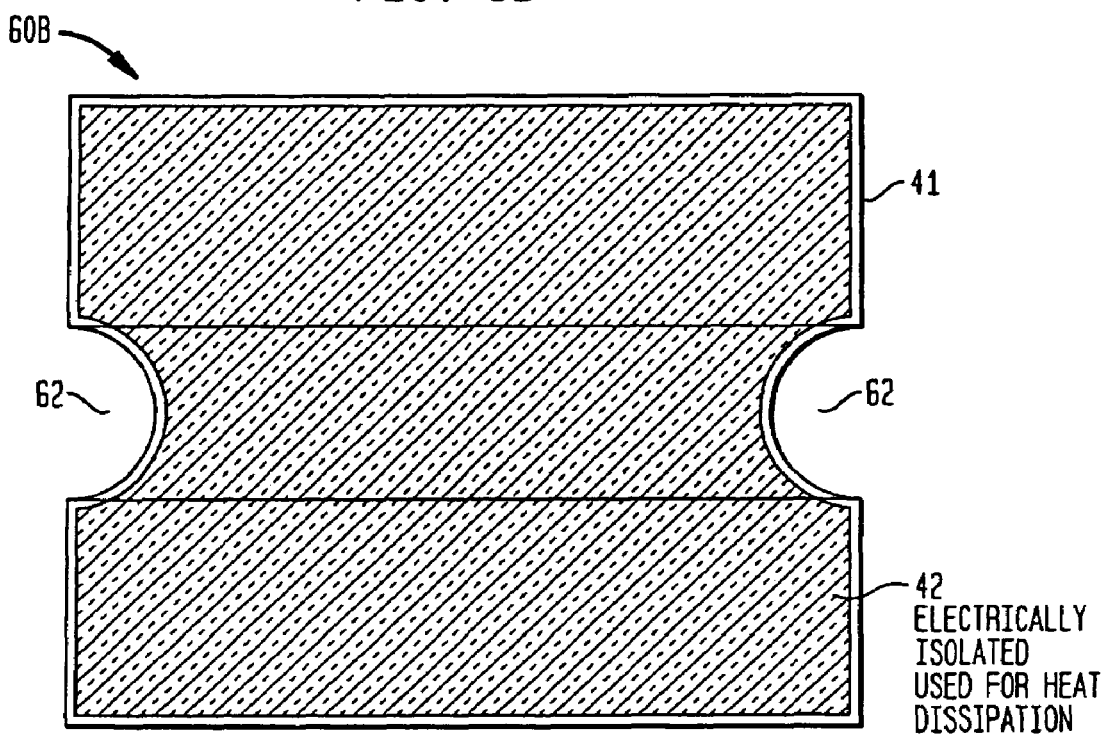

FIGS. 6(a) and 6(b) are bottom views of packaged assemblies 60A, 60B, respectively, adapted for bolt down assembly (BDA) on a printed circuit board, according to exemplary embodiments of the present invention. The bottom surface of the LED assemblies 60A, 60B includes a thermally conductive material 42.

According to an embodiment of the present invention, the assembly 60A shown in FIG. 6(a), includes one peripheral bolt hole 62. The term "bolt hole" as used herein is intended to encompass not only an opening but also a partial opening shaped to accommodate a bolt, screw, rivet, or similar fastener. According to another embodiment of the present invention, the LED assembly 60B of FIG. 6(b) includes two peripheral bolt holes 62. One having ordinary skill in the art will appreciate that the LED assembly 60A, 60B, may include any number of bolt holes 62, and, further, the bolt holes may be disposed peripherally or at any other location relative to the LED assembly 60A, 60B.

Figure 7:
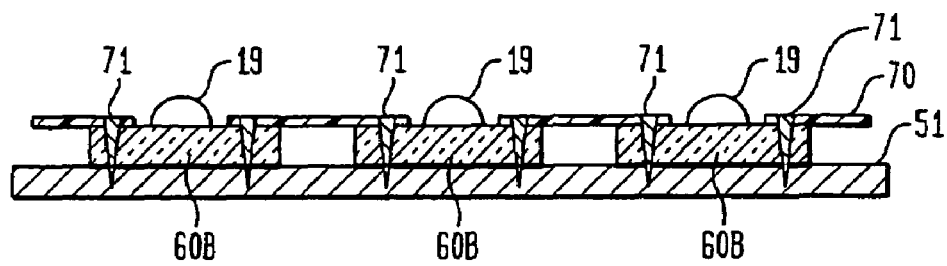
FIG. 7 schematically illustrates a plurality of packaged LED assemblies mounted on a printed wiring board according to a bolt down assembly technique, according to an embodiment of the present invention.

FIG. 7 shows a plurality of packaged LED assemblies 60B mounted on a heat sink and attached to an apertured printed wiring board 70 according to a bolt down assembly technique. The apertured printed wiring board 70 is bolted to the heat sink 51 using bolts, screws, rivets, or any suitable fastener 71 that is capable of passing through one or more bolt holes 62 arranged in the assemblies 60B.

It is to be appreciated that bolt down assembly does not require solder or adhesive for attachment to the heat sink 51. One having ordinary skill in the art will appreciate that the heat sink may be composed of any suitable material, such as, for example, metal. Optionally, a thermal-conductivity promoter, such as a thermal grease, may be deposited between the bottom surfaces of assemblies 60B and the heat sink 51. Advantageously, the conductivity promoter reduces the thermal resistance in the connection between the surface of the LED assembly 60B and the surface of the heat sink 51.

Figure 8:
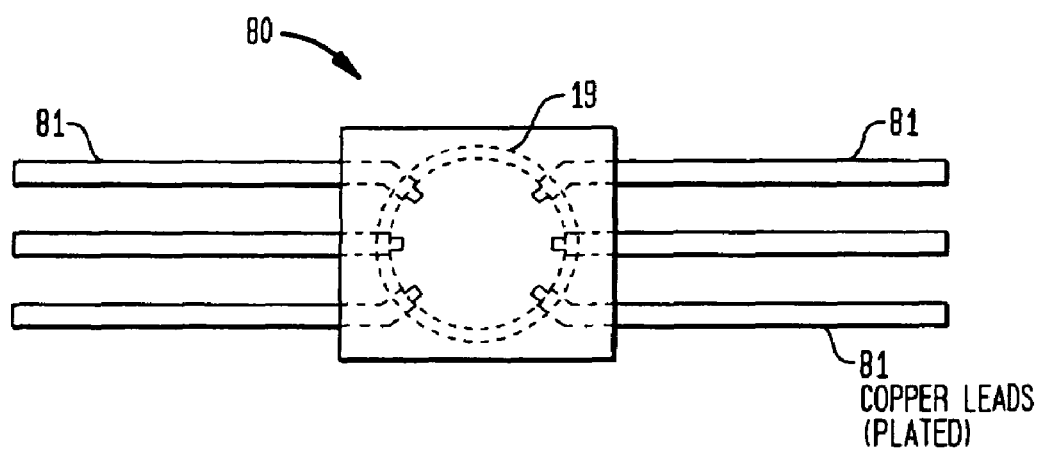
FIG. 8 is a schematic top view of a packaged LED assembly including a plurality of metal leads, according to an embodiment of the present invention.

FIG. 8 is a top view of an LED assembly 80 including one or more leads 81, preferably composed of metal, extending beyond the periphery of the LED assembly 80, according to an embodiment of the present invention. According to an embodiment of the present invention, the leads 81 may be wire bonded to LED die (not shown) at or near the peripheral edge of the surface cavity. Advantageously, the leads 81 may be sandwiched between a pair of insulating layers (e.g., insulating layers 12 shown in FIG. 1) that overlie the metal base. Preferably, the leads 81 comprise copper.

FIG. 9 illustrates the mounting of an LED assembly 80 on an apertured printed circuit board 90 and a heat sink 91. The apertured printed circuit board 90 may be disposed on the heat sink 91 in such a way that an aperture of the circuit board forms a surface cavity bounded by circuit board edges 93. The LED assembly 80 is mounted at least partially within the cavity, and such that a thermally conductive base (not shown) is in thermal contact with the heat sink 91. Further, the leads 81 may be soldered to corresponding conductive mating pads (not shown) on the board 90.

Preferably, the packaged LED assemblies described in each of the above embodiments are low-temperature co-fired ceramic-metal ("LTCC-M") structures. The fabrication of LTCC-M structures is described in the section below.

II. LTCC-M Fabrication

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750-950° C.

The composition of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Where optical components, such as LEDs are installed, the walls of the ceramic layers can be shaped and/or coated to enhance the reflective optical properties of the package. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure are advantageously matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, "Integrated heat sinking packages using low temperature co-fired ceramic metal circuit board technology", issued Sep. 24, 2002 to Ponnuswamy et al. and assigned to Lamina Ceramics, Inc. U.S. Pat. No. 6,455,930 is incorporated by reference herein. The LTCC-M structure is further described in U.S. Pat. Nos. 5,581,876, 5,725,808, 5,953,203, and 6,518,502, all of which are assigned to Lamina Ceramics, Inc. and are also incorporated by reference herein.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

In the simplest form, LTCC-M technology is used to provide an integrated package for a semiconductor LED die and accompanying circuitry, wherein the conductive metal support board provides a heat sink for the LED die. Referring to FIG. 10, bare LED die 100, for example, may be mounted directly onto a metal base 101 of the LTCC-M system having high thermal conductivity to cool the die 100. In such case, the electrical signals used to operate the die 100 may be connected to the component from the ceramic 102. In FIG. 10, a wire bond 103 serves this purpose. Indirect attachment to the metal support board 101 may also be used.

According to an embodiment of the present invention, all of the components are mounted on the metal support board 101, incorporating passive components such as electrodes and bonding pads 105, thermal connector pads 106, and conductive vias 107 into the multilayer ceramic portion, to connect the various components, i.e., semiconductor components, circuits, heat sink and the like, in an integrated package. Optionally, the package may be hermetically sealed within an encapsulant 108.

For a more complex structure having improved heat sinking, the integrated package according to an embodiment of the present invention may combine a first and a second LTCC-M substrate. The first substrate may have mounted thereon a semiconductor device and/or a multilayer ceramic circuit board with embedded circuitry for operating the component. Further, the second substrate may have a heat sink or conductive heat spreader mounted thereon. Thermoelectric (TEC) plates (Peltier devices) and temperature control circuitry may be mounted between the first and second substrates to provide improved temperature control of semiconductor devices. Optionally, a hermetic enclosure may be adhered to the metal support board.

The use of LTCC-M technology marries the advantages of flip chip packaging with the advantages of integrated heat sinking. The LED assembly packages according to an embodiment of the present invention may be made smaller, cheaper and more efficient than existing present-day packaging. Advantageously, a metal substrate may serve as a heat spreader or heat sink. A flip chip may be mounted directly on the metal substrate, which is an integral part of the package, eliminating the need for additional heat sinking. A flexible circuit can be mounted over the bumps on the flip chip. The use of multilayer ceramic layers also allows for a fan-out and routing of traces to the periphery of the package, further improving heat sinking. The LTCC-M technology described herein may be used in many high power integrated circuits and devices that have high thermal management needs.

It is understood that the above-described embodiments are illustrative of only a few of the many possible specific embodiments, which can represent applications of the invention. Numerous and varied other arrangements can be made by those skilled in the art without departing from the scope of the invention.

What is claimed is:

1. A LED assembly adapted for surface mounting and high temperature operation, the LED assembly comprising:
   a thermally conducting base, wherein at least a portion of the thermally conducting base is substantially planar;
   one or more electrically insulating layers overlying at least a portion of the planar portion of the thermally conducting base and defining a surface cavity, wherein the electrically insulating layers include one or more terminals;
   one or more LED die disposed at least partially within the surface cavity, wherein the one or more LED die are in thermal contact with the planar portion of the thermally conducting base, and electrically connected to the one or more terminals of the one or more insulating layers,
   wherein a bottom surface of the LED assembly includes a thermally conductive region in solderable thermal contact with the thermally conducting base, for spreading heat transmitted to the base from the one or more LED die; and
   further comprising an LED assembly mount selected from the group consisting of an electrically insulated fastener and a solderable bonding pad.

2. The LED assembly of claim 1, wherein the thermally conductive region is an integral part of the thermally conducting base.

3. The LED assembly of claim 1, wherein the bottom surface of the LED assembly further comprises one or more electrically conductive regions adapted for electrical connection with the one or more terminals, and adapted for electrical insulation from the thermally conductive region.

4. The LED assembly of claim 1 further comprising one or more metal leads extending beyond a periphery of the LED assembly for providing an electrical path to the one or more LED die.

5. The LED assembly of claim 4, wherein the one or more metal leads are vertically sandwiched between a pair of insulating layers overlying the thermally conducting base, the leads overhanging the edge of the LED assembly.

6. The LED assembly of claim 1, wherein the thermally conducting base includes a metal base.

7. The LED assembly of claim 6, wherein the metal base includes one or more holes.

8. The LED assembly of claim 1, wherein the one or more electrically insulating layers include one or more layers of ceramic.

9. The LED assembly of claim 1, wherein the thermally conducting base and the one or more electrically insulating layers comprise a ceramic-coated metal structure made according to a LTCC-M fabrication process.

10. The LED assembly of claim 1, wherein the one or more LED die are at least partially encapsulated within the cavity.

11. A device comprising:
    a heat sink;
    an apertured board overlying the heat sink;
    one or more LED assemblies mounted on the apertured board and thermally coupled to the heat sink by a heat spreader, wherein each of the one or more LED assemblies includes:
    a thermally conducting base, wherein at least a portion of the thermally conducting base is substantially planar,
    one or more electrically insulating layers overlying at least a portion of the planar portion of the thermally conducting base and defining a surface cavity, wherein the electrically insulating layers include one or more terminals, and
    one or more LED die disposed at least partially within the surface cavity, wherein the one or more LED die are in thermal contact with the planar portion of the thermally conducting base and electrically connected to the one or more terminals of the one or more insulating layers,
    wherein a bottom surface of the LED assembly includes a thermally conductive region in thermal contact with the thermally conducting base, for spreading heat transmitted to the base from the one or more LED die; and
    further comprising an LED assembly mount selected from the group consisting of an electrically insulated fastener and a solderable bonding pad.

12. The device according to claim 11, wherein the heat spreader extends through the apertured board from the bottom of the LED assembly to the heat sink.

13. The device according to claim 11, wherein the one or more LED assemblies each include one or more metal leads extending beyond a periphery of the LED assembly for providing an electrical path to the one or more LED die.

14. The device according to claim 13, wherein the one or more metal leads are attached to the apertured board.

15. The device of claim 11, wherein the one or more LED die are at least partially encapsulated within the cavity.

16. The device according to claim 11, wherein the thermally conducting base and the one or more electrically insulating layers comprise a ceramic-coated metal structure made according to a LTCC-M fabrication process.

17. A device comprising:
an apertured board;
one or more LED assemblies mounted underlying the apertured board, wherein each of the one or more LED assemblies includes:
a thermally conducting base, wherein at least a portion of the thermally conducting base is substantially planar,
one or more electrically insulating layers overlying at least a portion of the planar portion of the thermally conducting base and defining a surface cavity, wherein the electrically insulating layers include one or more terminals, and
one or more LED die disposed at least partially within the surface cavity, wherein the one or more LED die are in thermal contact with the planar portion of the thermally conducting base and electrically connected to the one or more terminals of the one or more insulating layers,
wherein a bottom surface of the LED assembly includes a thermally conductive region in thermal contact with the thermally conducting base, for spreading heat transmitted to the base from the one or more LED die;
a heat sink thermally coupled to the bottom surface of each of the one or more LED assemblies; and
further comprising an LED assembly mount selected from the group consisting of an electrically insulated fastener and a solderable bonding pad.

18. The device of claim 17, wherein each of the one or more LED die are aligned with an aperture in the apertured board.

19. The device of claim 17, wherein the one or more LED die are at least partially encapsulated within the cavity.

20. The device according to claim 17, wherein the thermally conducting base and the one or more electrically insulating layers comprise a ceramic-coated metal structure made according to a LTCC-M fabrication process.

21. A device comprising:
an apertured board;
a heat sink;
one or more LED assemblies mounted between the apertured board and the heat sink, wherein each of the one or more LED assemblies includes:
a metal base including one or more holes, wherein at least a portion of the metal base is substantially planar,
one or more ceramic layers overlying at least a portion of the planar portion of the metal base and defining a surface cavity, wherein the ceramic layers include one or more terminals, and
one or more LED die disposed at least partially within the surface cavity, wherein the one or more LED die are in thermal contact with the planar portion of the metal base and electrically connected to the one or more terminals of the one or more ceramic layers,
wherein a bottom surface of the LED assembly includes a thermally conductive region in thermal contact with the metal base, for spreading heat transmitted to the base from the one or more LED die; and
further comprising an LED assembly mount selected from the group consisting of an electrically insulated fastener and a solderable bonding pad.

22. The device of claim 21, wherein the one or more LED assemblies are mounted between the apertured board and the heat sink by fasteners extending through the holes in the metal base, such that the one or more LED die are aligned with respective apertures in the apertured board.

23. The device of claim 21, wherein the one or more LED die are at least partially encapsulated within the cavity.

24. The device according to claim 21, wherein the thermally conducting base and the one or more electrically insulating layers comprise a ceramic-coated metal structure made according to a LTCC-M fabrication process.

* * * * *